United States Patent
Tajima et al.

(10) Patent No.: US 11,493,558 B2
(45) Date of Patent: Nov. 8, 2022

(54) ESTIMATION METHOD OF STATE OF CHARGE OF POWER STORAGE DEVICE AND ESTIMATION SYSTEM OF STATE OF CHARGE OF POWER STORAGE DEVICE

(71) Applicant: SEMICONDUCTOR ENERGY LABORATORY CO., LTD., Atsugi (JP)

(72) Inventors: Ryota Tajima, Kanagawa (JP); Akihiro Chida, Kanagawa (JP); Masataka Shiokawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/050,388

(22) PCT Filed: Apr. 12, 2019

(86) PCT No.: PCT/IB2019/053018
§ 371 (c)(1),
(2) Date: Oct. 23, 2020

(87) PCT Pub. No.: WO2019/207399
PCT Pub. Date: Oct. 31, 2019

(65) Prior Publication Data
US 2021/0116511 A1    Apr. 22, 2021

(30) Foreign Application Priority Data
Apr. 27, 2018 (JP) .............................. JP2018-086611

(51) Int. Cl.
*G01R 31/367* (2019.01)
*G01R 31/3842* (2019.01)
(Continued)

(52) U.S. Cl.
CPC ....... *G01R 31/367* (2019.01); *G01R 31/3842* (2019.01); *H01M 10/425* (2013.01);
(Continued)

(58) Field of Classification Search
CPC ............. G01R 31/367; G01R 31/3842; H01M 10/425; H01M 10/482; H01M 2010/4278; H01M 2220/20
USPC ......................................................... 702/63
See application file for complete search history.

(56) References Cited

U.S. PATENT DOCUMENTS

| 7,583,059 B2 | 9/2009 | Cho |
| 2003/0044658 A1* | 3/2003 | Hochgraf ............ H01M 16/006 429/432 |

(Continued)

FOREIGN PATENT DOCUMENTS

| CN | 001890574 A | 1/2007 |
| EP | 1469321 A | 10/2004 |

(Continued)

OTHER PUBLICATIONS

International Search Report (Application No. PCT/IB2019/053018) dated Jun. 11, 2019.

(Continued)

*Primary Examiner* — Michael P Nghiem
(74) *Attorney, Agent, or Firm* — Fish & Richardson P.C.

(57) ABSTRACT

A capacity measurement system of a secondary battery that estimates an SOC with high estimation accuracy in a short time at low cost is provided. The capacity measurement system of a secondary battery is an estimation system of a state of charge of a power storage device that includes a unit for acquiring time-series data of a voltage measured value and a current measured value of a first power storage device; a unit for normalizing the time-series data of the voltage measured value; a unit for normalizing the time-series data (Continued)

of the current measured value; a database creation unit for creating a database where an SOC of the first power storage device is linked to superimposed data of time-series data of a time axis corresponding to a vertical axis and time-series data of a time axis corresponding to a horizontal axis; and a neural network unit.

5 Claims, 11 Drawing Sheets

(51) Int. Cl.
    *H02J 7/00*     (2006.01)
    *H01M 10/42*     (2006.01)
    *H01M 10/48*     (2006.01)

(52) U.S. Cl.
    CPC ......... *H01M 10/482* (2013.01); *H02J 7/0048* (2020.01); *H01M 2010/4278* (2013.01); *H01M 2220/20* (2013.01)

(56) References Cited

U.S. PATENT DOCUMENTS

| | | |
|---|---|---|
| 2004/0207367 A1 | 10/2004 | Taniguchi et al. |
| 2005/0194936 A1 | 9/2005 | Cho |
| 2006/0181245 A1 | 8/2006 | Mizuno et al. |
| 2008/0234956 A1 | 9/2008 | Mizuno et al. |
| 2016/0231386 A1* | 8/2016 | Sung .................... G01R 31/367 |
| 2021/0055352 A1* | 2/2021 | Takahashi ............ G01R 31/367 |

FOREIGN PATENT DOCUMENTS

| | | |
|---|---|---|
| JP | 2004-333472 A | 11/2004 |
| JP | 2007-518973 | 7/2007 |
| JP | 2007-240308 A | 9/2007 |
| JP | 2008-232758 A | 10/2008 |
| JP | 2019-023853 A | 2/2019 |
| KR | 2005-0061386 A | 6/2005 |
| TW | 200531326 | 9/2005 |
| TW | 200919210 | 5/2009 |
| TW | 201843904 | 12/2018 |
| WO | WO-2005/059579 | 6/2005 |
| WO | WO-2018/203170 | 11/2018 |

OTHER PUBLICATIONS

Written Opinion (Application No. PCT/IB2019/053018) dated Jun. 11, 2019.

Taiwanese Office Action (Application No. 108113517) dated Aug. 30, 2022.

* cited by examiner

During charging

ESTIMATION METHOD OF STATE OF CHARGE OF POWER STORAGE DEVICE AND ESTIMATION SYSTEM OF STATE OF CHARGE OF POWER STORAGE DEVICE

CROSS REFERENCE TO RELATED APPLICATIONS

This application is a U.S. National Phase Application under 35 U.S.C. § 371 of International Application PCT/IB2019/053018, filed on Apr. 12, 2019, which is incorporated by reference and claims the benefit of a foreign priority application filed in Japan on Apr. 27, 2018, as Application No. 2018-086611.

TECHNICAL FIELD

One embodiment of the present invention relates to an object, a method, or a manufacturing method. Alternatively, the present invention relates to a process, a machine, manufacture, or a composition (a composition of matter). One embodiment of the present invention relates to a semiconductor device, a display device, a light-emitting device, a power storage device, a lighting device, an electronic device, or a manufacturing method thereof. One embodiment of the present invention relates to a vehicle or an on-board electronic device provided in the vehicle.

Note that in this specification, a power storage device refers to every element and device having a function of storing power. Examples of the power storage device include a storage battery (also referred to as a secondary battery) such as a lithium-ion secondary battery, a lithium-ion capacitor, an all-solid-state battery, and an electric double layer capacitor.

One embodiment of the present invention relates to a neural network and a power storage system using the neural network. In addition, one embodiment of the present invention relates to a vehicle using a neural network. Furthermore, one embodiment of the present invention relates to an electronic device using a neural network. Moreover, one embodiment of the present invention relates to a charging control system using a neural network.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density have rapidly grown with the development of the semiconductor industry, for portable information terminals such as mobile phones, smartphones, tablets, and laptop computers; portable music players; digital cameras; medical equipment; next-generation clean energy vehicles such as hybrid electric vehicles (HEV), electric vehicles (EV), and plug-in hybrid electric vehicles (PHEV); and the like. The lithium-ion secondary batteries are essential as rechargeable energy supply sources for modern information society.

In a portable information terminal, an electric vehicle, or the like, a plurality of secondary batteries connected in series or in parallel and provided with a protection circuit is used as a battery pack (also referred to as an assembled battery).

In recent years, machine learning techniques such as an artificial neural network (hereinafter referred to as a neural network) have been actively developed.

Patent Document 1 shows an example where a neural network is used for calculation of the remaining capacity of a secondary battery.

PRIOR ART DOCUMENT

Patent Document

[Patent Document 1] United States Published Patent Application No. 2006/0181245

SUMMARY OF THE INVENTION

Problems to be Solved by the Invention

In a vehicle in which a secondary battery is incorporated, regenerative power generated at braking or the like can be charged to the secondary battery, and the secondary battery might not be used properly due to overcharging. In order to avoid occurrence of the problem of overcharging or overdischarging in advance, the remaining capacity of the secondary battery, i.e., the SOC of the secondary battery needs to be estimated with high accuracy. A method for estimating the state of charge of a secondary battery with high estimation accuracy or a method for controlling a power storage device is provided.

Furthermore, when degradation of the secondary battery progresses, the SOC estimation accuracy might be significantly decrease. Note that the SOC is defined as a proportion of the remaining capacity to the maximum capacity of the secondary battery. When the maximum capacity of the secondary battery is calculated from a time integral of current by discharging after full charging, the time it takes to perform discharging might be long.

A method for estimating the state of charge of a secondary battery that has high estimation accuracy even when degradation of the secondary battery progresses is provided. Furthermore, a capacity measurement system of a secondary battery that estimates an SOC with high estimation accuracy in a short time at low cost is provided.

Means for Solving the Problems

First charging performance data where a vertical axis represents voltage and a horizontal axis represents time and second charging performance data where a vertical axis represents current and a horizontal axis represents time are used to remove data during an idle period, so that data during a CCCV charging period is removed. Then, normalization is performed while the voltage of the vertical axis in the first charging performance data is set to 1 and the current of the vertical axis in the second charging performance data is set to 1 so that data of a square matrix (n rows and n columns, where n is an integer of greater than or equal to 50) is formed. Lastly, one of the two pieces of data where the horizontal axes represent time rotates 90° (i.e., the vertical axis represents time), and separate labels (here SOC values) are used for a piece of image data for learning obtained by superimposition of the two pieces of data so that evaluation and learning are performed. A plurality of pieces of such image data for learning are prepared to construct a database. A neural network (NN: Neural Network) model or a convolutional neural network (CNN: Convolutional Neural Network) model is used to calculate the SOC of the secondary battery based on learned content.

A structure disclosed in this specification is an estimation system of a state of charge of a power storage device that includes a unit for acquiring time-series data of a voltage measured value and a current measured value of a first power storage device; a unit for normalizing the time-series data of the voltage measured value; a unit for normalizing the time-series data of the current measured value; a database creation unit for creating a database where an SOC of the first power storage device is linked to superimposed data of time-series data of a time axis corresponding to a vertical axis and time-series data of a time axis corresponding to a horizontal axis; and a neural network unit where a neural network is constructed using the database created in advance as learning data, superimposed data of time-series data of a time axis corresponding to a vertical axis and time-series data of a time axis corresponding to a horizontal axis of a second power storage device is input, and an estimated SOC value of the second power storage device is output.

Note that the normalization is to transform data or the like in accordance with a certain rule, organize the data or the like to be handled efficiently, and make the data or the like more accessible. In this specification, since two pieces of data are superimposed, processing data such that the two pieces of data are data of a square matrix having the same number of rows and columns is also included in the normalization. Furthermore, in learning, eliminating a region in data with a small amount of change (e.g., an idle period, a period during which CCCV charging is performed, or the like) is also included in the normalization.

Moreover, learning data where pieces of temperature data are superimposed is prepared, and SOC calculation or the like may be performed using a piece of data where the first charging performance data in which the vertical axis represents voltage and the horizontal axis represents time, the second charging performance data in which the vertical axis represents current and the horizontal axis represents time, and the temperature data are superimposed on each other.

In addition, in the above structure, the second power storage device is not limited to one battery cell and may be an assembled battery including a plurality of battery cells.

In addition, in the above structure, in the database creation unit, data where a vertical axis represents a voltage value of the first power storage device and a horizontal axis represents a time axis is superimposed on data where a horizontal axis represents a current value of the first power storage device and a vertical axis represents a time axis.

Furthermore, a method for superimposing the data is not particularly limited as long as the time axes do not overlap with each other and may be, for example, a method for superimposing data where a vertical axis represents a current value of the first power storage device and a horizontal axis represents a time axis on data where a horizontal axis represents a voltage value of the first power storage device and a vertical axis represents a time axis in the database creation unit. Compared to the case where the time axes coincide with each other to overlap with each other, SOC estimation accuracy is increased in the case where the time axes are provided as the vertical axis and the horizontal axis.

Furthermore, algorithm is not limited to the NN, and the CNN, an SVR, an RVM (Relevance Vector Machine), random forest, or the like may be used. Moreover, although a circuit configuration becomes large, calculation may be performed through a combination of the CNN and an LSTM (Long Short-Term Memory).

Although a lithium-ion secondary battery is described as an example, the present invention can also be applied to another battery (e.g., an all-solid-state battery or the like). By changing a battery model as appropriate in accordance with the kind of battery, the present invention can perform SOC estimation with high accuracy.

In this specification, the state of charge (SOC) is expressed as a percentage of the sum of the remaining capacity of the secondary battery and the amount of electricity charged to the capacity of the secondary battery at full charging. Calculation of the amount of electricity charged is needed to calculate the state of charge, and the amount of electricity charged can be calculated using the number of pulses in a short time, a current value of charging current, and an on-duty cycle.

Effect of the Invention

Time-series data of electrical performance of the power storage device is normalized, one of the two pieces of data rotates 90° to be superimposed on the other of the two pieces of data to construct the neural network, and the data is input, so that an SOC with high accuracy can be output. Learning can be performed depending on the kind of power storage device to construct the neural network, so that a system that outputs an SOC with high accuracy can be provided.

MODE FOR CARRYING OUT THE INVENTION

Embodiments of the present invention will be described in detail with reference to the drawings. Note that the present invention is not limited to the following description, and it will be readily understood by those skilled in the art that modes and details of the present invention can be modified in various ways. In addition, the present invention should not be construed as being limited to the description of embodiments below.

Embodiment 1

Figure 1:
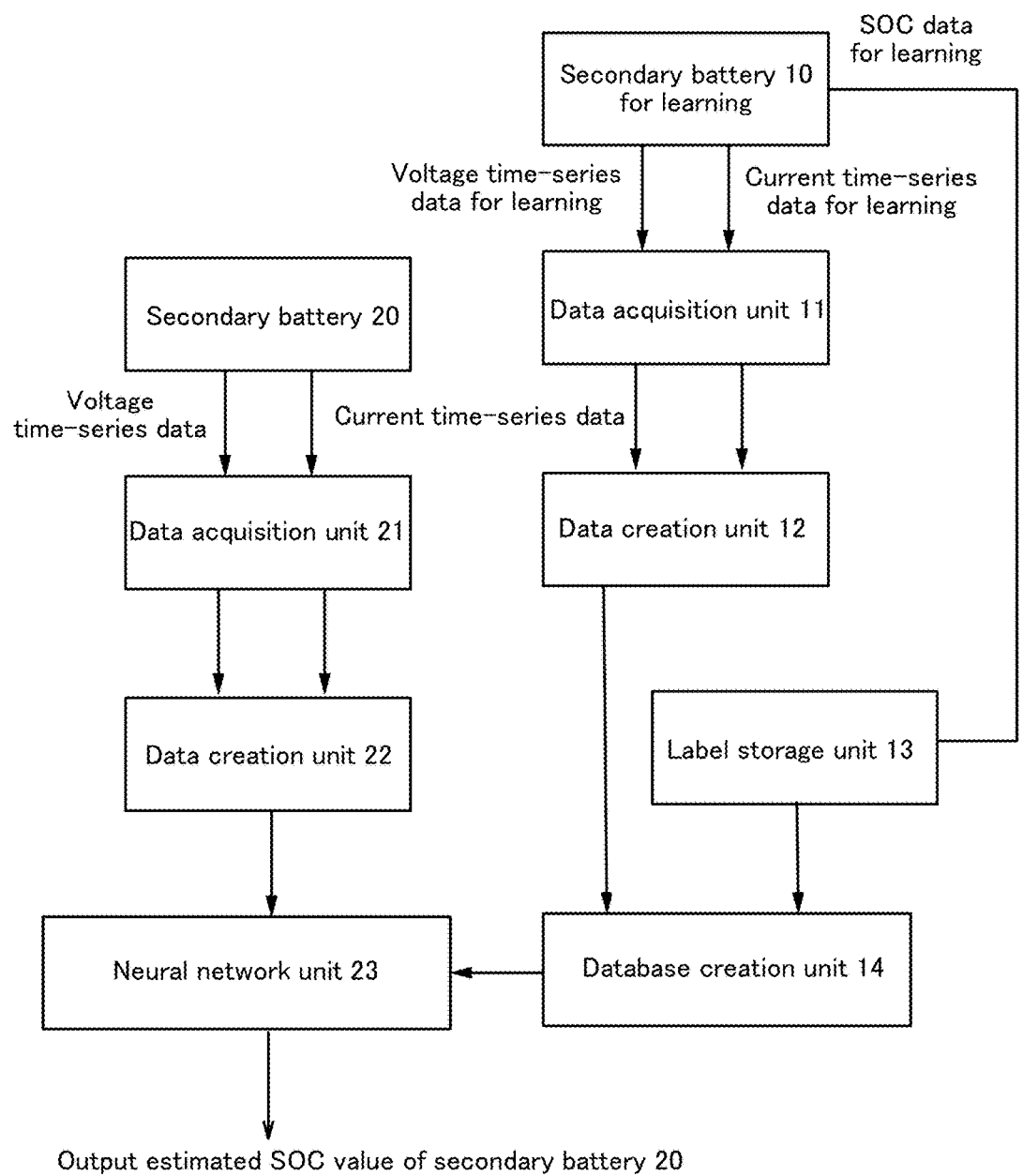
FIG. 1 A configuration diagram of an estimation system of a state of charge of a power storage device showing one embodiment of the present invention.

FIG. 1 is an example of a configuration diagram of an estimation system of a state of charge of a power storage device showing one embodiment of the present invention.

In an estimation system of a state of charge of a power storage device, a neural network unit 23 is first constructed by a database creation unit 14 using current time-series data, voltage time-series data, SOC data for learning of a secondary battery 10 for learning. Second, current time-series data and voltage time-series data of a secondary battery 20 are input to the constructed learned neural network unit 23, and the SOC of the target secondary battery 20 is output. The current time-series data and the voltage time-series data are measured by a data acquisition unit 11 and are stored in a memory or the like. A data creation unit 12 makes the database creation unit 14 store acquired data as normalized data. In addition, the SOC data for learning that corresponds to the normalized data is stored in a label storage unit 13 and is linked to data in the database creation unit 14.

The estimation system of a state of charge of a power storage device includes a data acquisition unit 21, a data creation unit 22, and the neural network unit 23. The neural network unit 23 is composed of a circuit (a microcomputer) that performs neural network calculation and is an IC in which an AI (Artificial Intelligence) system is incorporated, for example.

Figure 2:
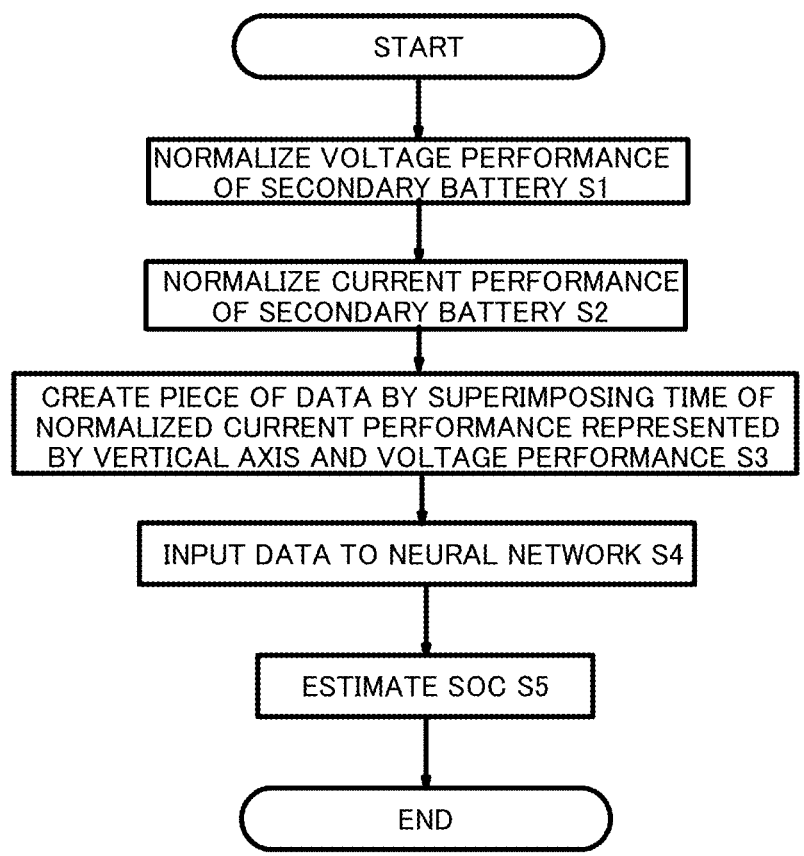
FIG. 2 A flow chart showing one embodiment of the present invention.

The estimation system of a state of charge of a power storage device can output an estimated SOC value in accordance with a flow chart shown in FIG. 2.

First, voltage time-series data and current time-series data are acquired in the data acquisition unit 21 that acquires parameters such as electrical performance and temperature of a secondary battery, and each of the voltage time-series data and the current time-series data is normalized. The order of the voltage performance (voltage time-series data) normalization (S1) and the current performance (current time-series data) normalization (S2) may be reversed. In the normalization, part of a region with a small change (e.g., an idle period or the like) may be eliminated.

Then, a vertical axis represents a time axis of the normalized current time-series data and the current time-series data is superimposed on the voltage time-series data so that a piece of data (also referred to as two-dimensional data or an image pattern) is produced (S3). In the case where the piece of data is produced, the lengths of the vertical axis and the horizontal axis are made substantially equal to each other and the piece of data is adjusted as appropriate not to have a too large blank area.

Then, the piece of data is input to the learned neural network (S4). An SOC is estimated with high accuracy by calculation in the neural network unit 23 according to the above series of steps (S5).

Figure 3A:
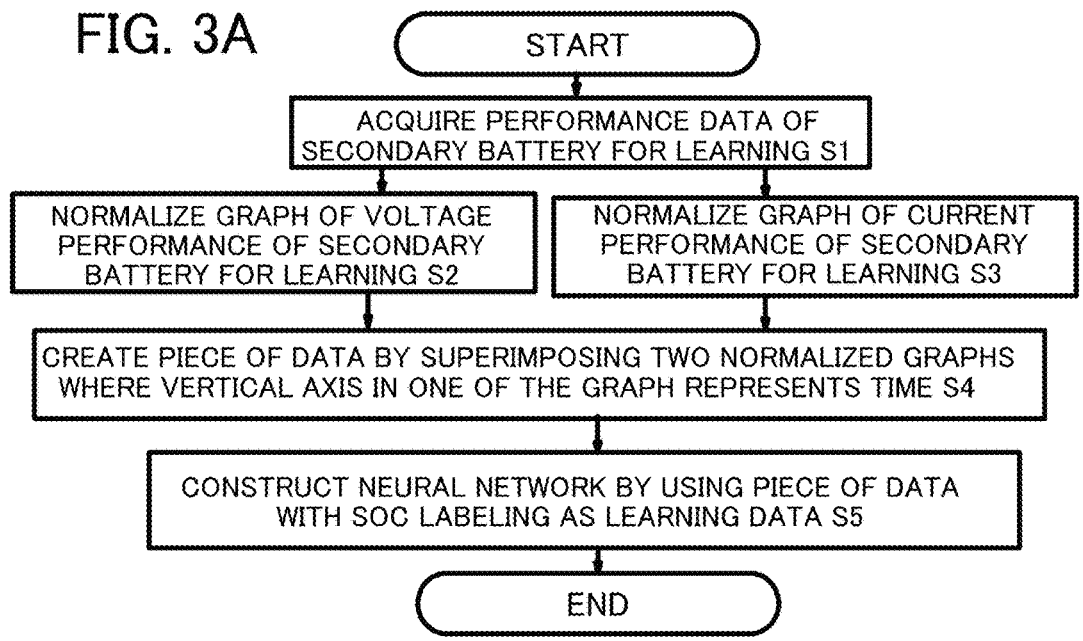
FIGS. 3A to 3D A flow chart showing one embodiment of the present invention.

In addition, here, learning of the neural network is described below with reference to FIG. 3. FIG. 3(A) is an example of a flow chart of learning.

Figure 3B:
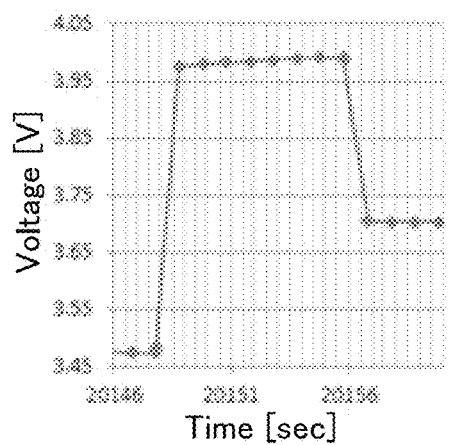
Figure 3C:
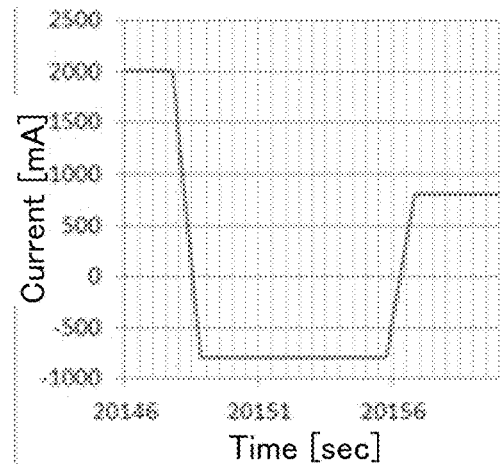

In this embodiment, in order to check the SOC accuracy, learning is performed using one battery cell NCR18650B and data (including an SOC value) that is acquired from charging and discharging cycle test patterns for an EV described in International Standard IEC62660-01. FIG. 3(B) shows normalized voltage time-series data, and FIG. 3(C) shows normalized current time-series data.

Here, a description is made using the charging and discharging cycle test patterns described in IEC62660-01; however, it is preferable to use charging and discharging data based on actual behavior of an assumed application for learning. In the case where a plurality of pieces of data are prepared, the pieces of data are repeatedly accumulated, and measurement at different ambient temperatures or measurement of a cell with degradation caused by repeated cycles is further preferably added. Note that a secondary battery for learning has the same size and the same kind as those of a secondary battery to be examined, preferably a secondary battery for learning whose manufacturing time is close to that of the secondary battery to be examined is used, further preferably a secondary battery for learning that is in the same lot as that of the secondary battery to be examined is used, in which case the SOC can be output with higher accuracy.

Figure 3D:
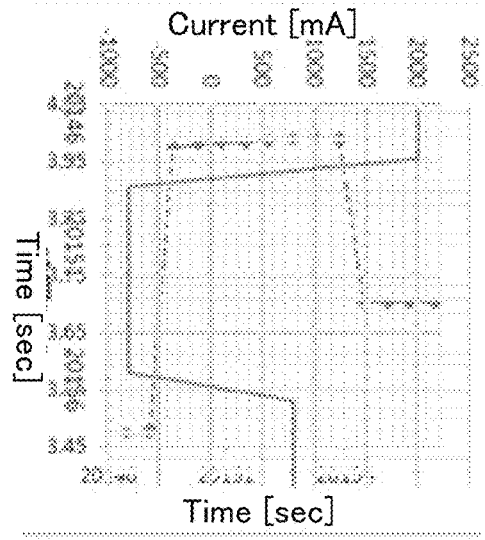
Figure 4A:
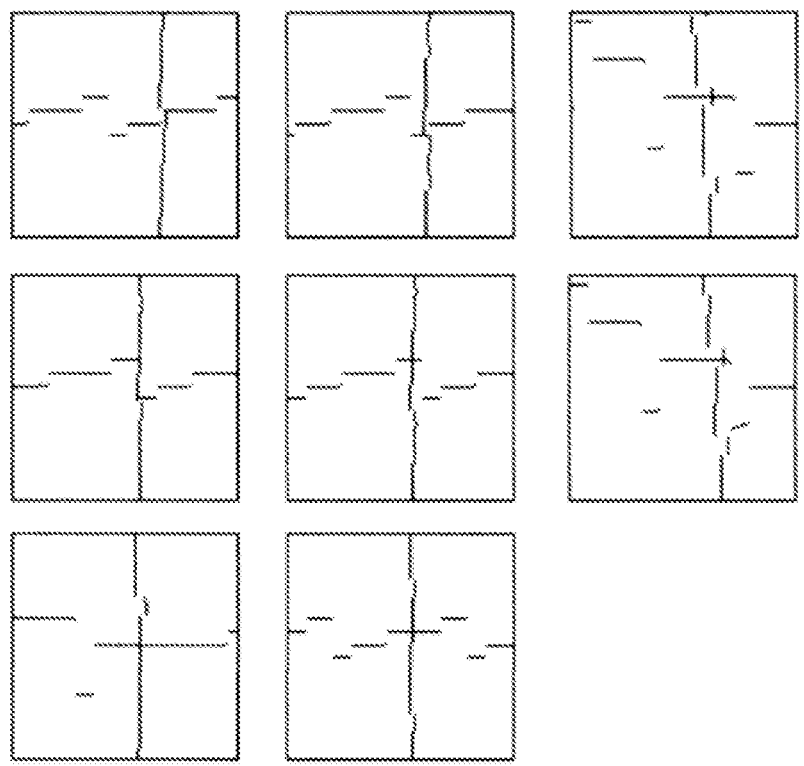
FIGS. 4A and 4B Examples of secondary battery time-series data and a graph showing SOC inference values.
Figure 5:
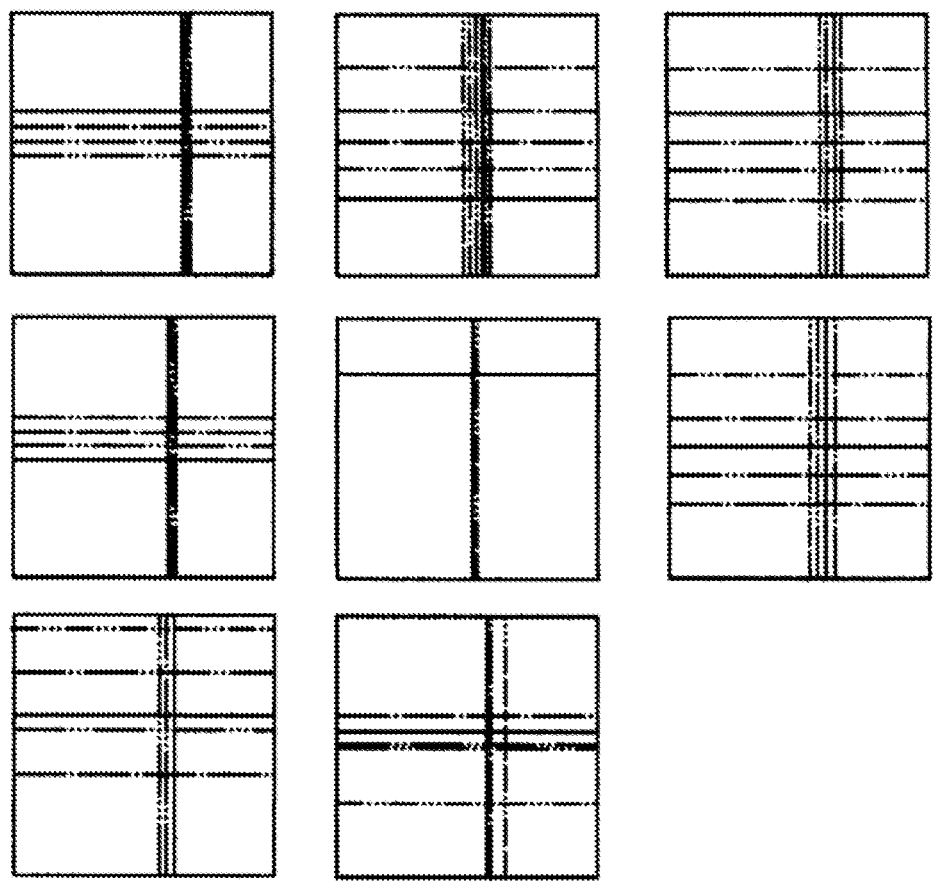
FIG. 5 Other examples of the secondary battery time-series data.

Then, FIG. 3(D) is a conceptual diagram where a vertical axis represents a time axis of normalized current time-series data and the current time-series data is superimposed on voltage time-series data. A piece of data shown in FIG. 3(D) is used as image data for learning and learning data is accumulated by using labels for corresponding SOCs so that a database is created. The image data for learning is encoded digital data. A time axis in the digital data can also be expressed depending on lightness (a grayscale value). The image data for learning uses a method similar to that of a data set called MNIST. A feature value of an image (image pixel information (in a range of greater than or equal to 0 and less than or equal to 255) is generalized to learn which feature corresponds to which correct label (here SOC value). In the database, a lot of data is prepared as shown in FIG. 4(A). In FIG. 4(A), 100×100 pieces of data for a time of 100 seconds (10000 columns in total) are prepared. In addition, a neural network is constructed in accordance with the database (S5). Note that the corresponding SOC is a value with the last data of the time axis. FIG. 5 shows an example different from that in FIG. 4(A), in which a data field and time are expressed by line contrast so that they can be separately set. In FIG. 5, a lot of data is prepared while the maximum lightness is linear data after 100 seconds and the maximum darkness is linear data at one second. Similarly, the data of the 10000 columns in total may be used as data for learning. As described above, learning data can be prepared efficiently by processing data such that an image with superimposed data has a feature.

Figure 4B:
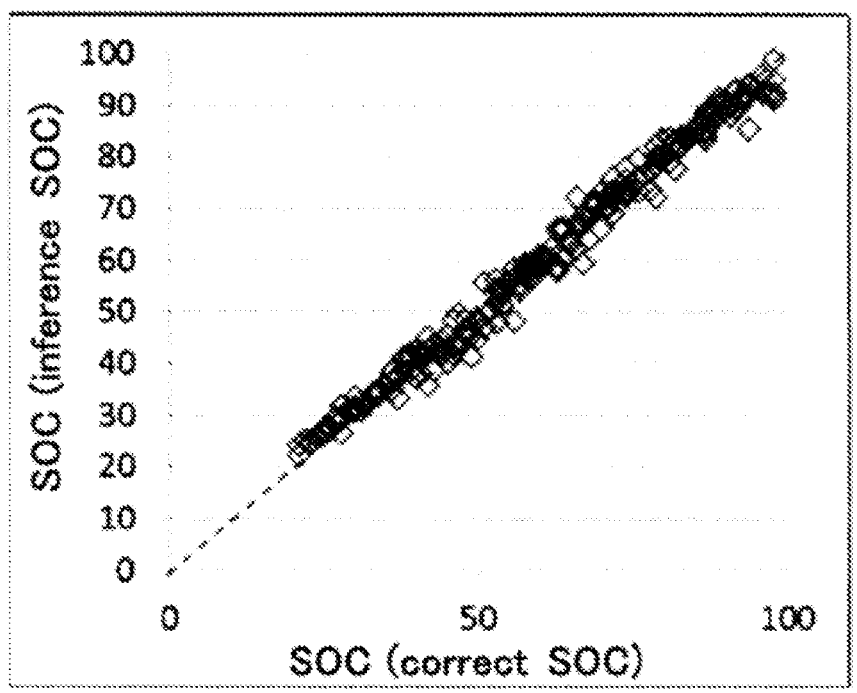

FIG. 4(B) shows output results of the SOC of the secondary battery to be examined.

Figure 11A:
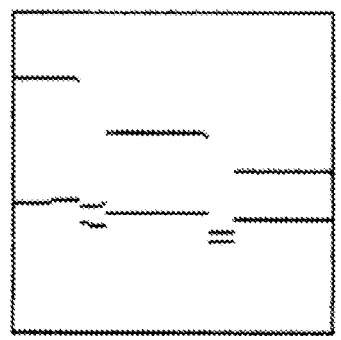
FIGS. 11A and 11B A graph showing SOC inference values in a comparative example.
Figure 11B:
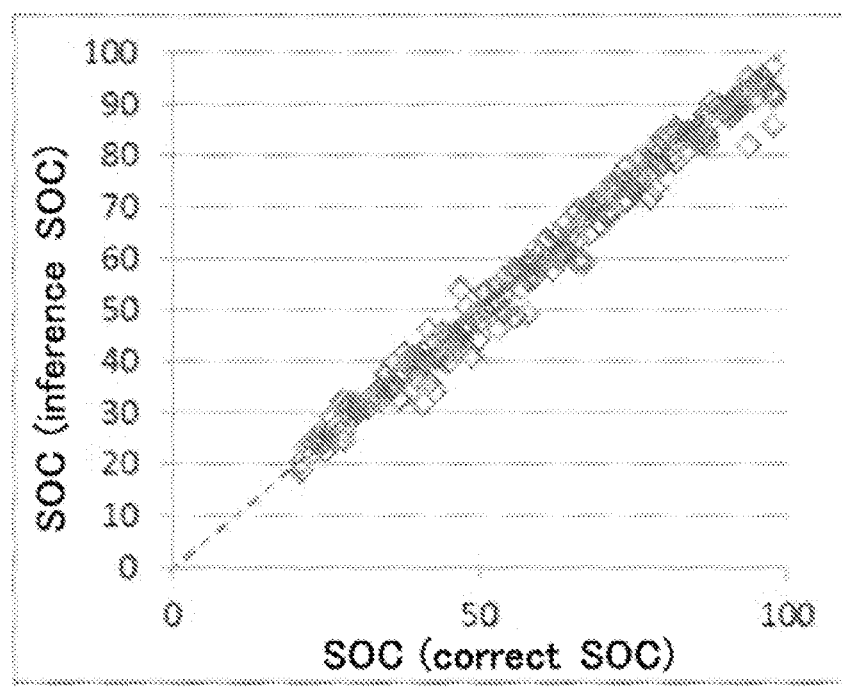

In addition, as a comparative example, FIG. 11(B) shows output results of the SOC where a database is created by superimposing time axes of normalized current time-series data and normalized voltage time-series data on horizontal axes. Note that FIG. 11(A) shows a piece of superimposed graphic data for 100 seconds. The accuracy of SOC inference values in FIG. 11(B) is lower than that in FIG. 4(B), which indicates that the method shown in this embodiment is effective.

Although an example in which measured IEC data is used is described in this embodiment, in the case where a neural network is constructed based on secondary battery data for learning in advance, usage history data of the secondary battery to be examined is actually obtained at regular time intervals or in real time so that the SOC can be estimated with high accuracy.

Embodiment 2

In this embodiment, a structure example of a neural network NN used in Steps S4 and S5 shown in FIG. 2 in Embodiment 1, that is, used for neural network processing when secondary battery states are classified is shown. For the neural network processing, a tool installed in Python (registered trademark) or Matlab (registered trademark) is used.

Figure 6:
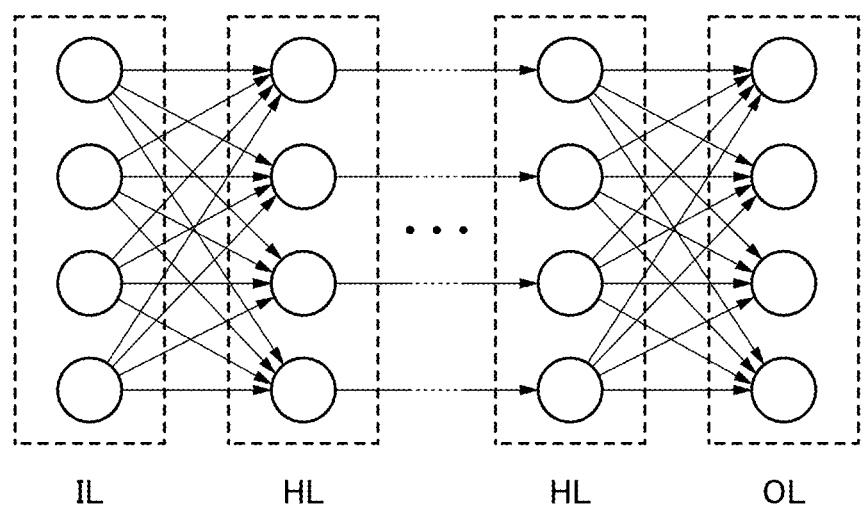
FIG. 6 A diagram showing a neural network structure.

FIG. 6 illustrates an example of a neural network of one embodiment of the present invention. A neural network NN illustrated in FIG. 6 includes an input layer IL, an output layer OL, and a hidden layer (middle layer) HL. The neural network NN can be formed of a neural network including a plurality of hidden layers HL, that is, a deep neural network.

Note that learning in a deep neural network is referred to as deep learning in some cases. The output layer OL, the input layer IL, and the hidden layers HL each include a plurality of neuron circuits, and the neuron circuits provided in the different layers are connected to each other through a synapse circuit.

A function of analyzing the state of a storage battery is added to the neural network NN by learning. Then, calculation processing is performed in each layer when the parameter of the measured storage battery is input to the neural network NN. The calculation processing in each layer is executed through the product-sum operation or the like of an output from a neuron circuit in the previous layer and a weight coefficient. Note that the connection between layers may be a full connection where all of the neuron circuits are connected or may be a partial connection where some of the neuron circuits are connected.

For example, a convolutional neural network (CNN), which includes a convolutional layer and a pooling layer in which only specific units in adjacent layers have connection, may be used. The CNN is used for classification of image data that is converted from charging performance data, for example. In the convolutional layer, product-sum operation of the image data and a weight parameter is performed, for example. The pooling layer is preferably placed directly after the convolutional layer.

The convolutional layer has a function of performing convolution on image data. The convolution is performed by repetition of the product-sum operation of part of the image data and a weight parameter's filter value. Features of the image data are extracted through the convolution in the convolutional layer.

A weight parameter (also referred to as a weight filter) can be used for the convolution. The image data input to the convolutional layer is subjected to filter processing using the weight parameter.

The data subjected to the convolution is converted by an activation function, and then is output to the pooling layer. As the activation function, ReLU (Rectified Linear Units) or the like can be used. The ReLU is a normalization linear function in which "0" is output when an input value is negative and the input value is directly output when the input value is greater than or equal to "0." In addition, as the activation function, a sigmoid function, a tanh function, or the like can also be used.

The pooling layer has a function of performing pooling on the image data input from the convolutional layer. Pooling is processing in which the image data is partitioned into a plurality of regions, and predetermined data is extracted from each of the regions and the data are arranged in a matrix. The pooling reduces the image data with the features extracted by the convolutional layer remaining. Note that as the pooling, max pooling, average pooling, Lp pooling, or the like can be used.

In the convolutional neural network (CNN), feature extraction is performed using the convolution processing and pooling processing. Note that the CNN can be composed of a plurality of convolutional layers and a plurality of pooling layers.

A fully-connected layer is preferably placed after several convolutional layers and several pooling layers that are arranged alternately, for example. A plurality of fully-connected layers may be placed. The fully-connected layer preferably has a function of determining whether a secondary battery is normal or abnormal by using the image data subjected to the convolution and the pooling.

In addition, this embodiment can be freely combined with Embodiment 1.

Embodiment 3

Figure 7A:
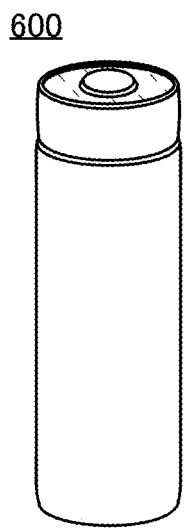
FIGS. 7A to 7C Diagrams showing secondary battery structures.
Figure 7B:
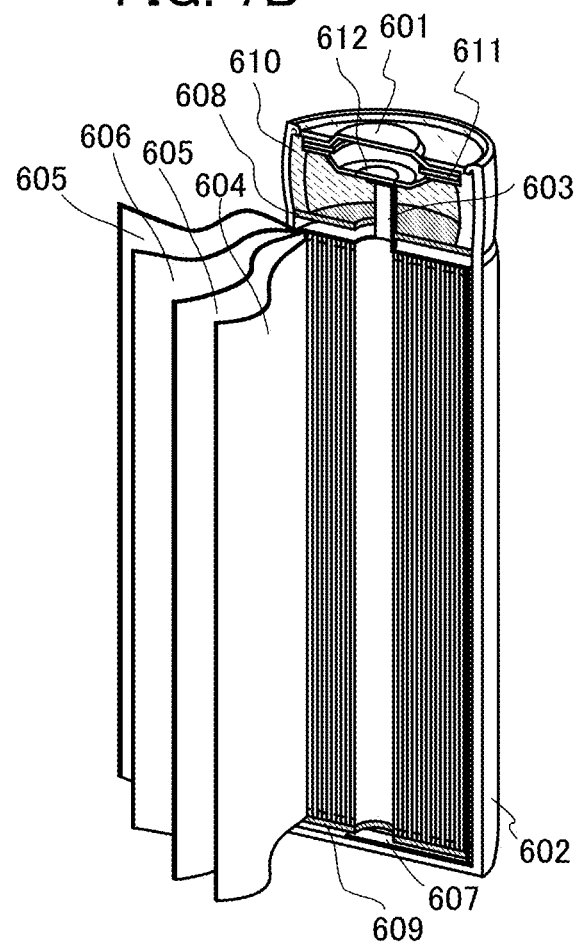

An example of a cylindrical secondary battery is described with reference to FIG. 7(A) and FIG. 7(B). As illustrated in FIG. 7(B), a cylindrical secondary battery 600 includes a positive electrode cap (battery lid) 601 on a top surface and a battery can (outer can) 602 on a side surface and a bottom surface. The positive electrode cap 601 and the battery can (outer can) 602 are insulated from each other by a gasket (insulating packing) 610.

FIG. 7(B) is a diagram schematically illustrating a cross-section of the cylindrical secondary battery. Inside the battery can 602 having a hollow cylindrical shape, a battery element in which a belt-like positive electrode 604 and a belt-like negative electrode 606 are wound with a separator 605 located therebetween is provided. Although not illustrated, the battery element is wound centering around a center pin. One end of the battery can 602 is closed and the other end thereof is opened. For the battery can 602, a metal having corrosion resistance to an electrolyte solution, such as nickel, aluminum, or titanium, an alloy of such a metal, or an alloy of such a metal and another metal (e.g., stainless steel or the like) can be used. Alternatively, the battery can 602 is preferably covered with nickel, aluminum, or the like in order to prevent corrosion due to the electrolyte solution. Inside the battery can 602, the battery element in which the positive electrode, the negative electrode, and the separator are wound is sandwiched between a pair of insulating plates 608 and 609 that face each other. Furthermore, a nonaqueous electrolyte solution (not illustrated) is injected inside the battery can 602 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolyte solution in which an electrolyte composed of lithium salt such as $LiBF_4$ or $LiPF_6$ is dissolved in an organic solvent such as ethylene carbonate or diethyl carbonate, and the like.

Since a positive electrode and a negative electrode that are used for a cylindrical storage battery are wound, active materials are preferably formed on both surfaces of a current collector. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 612 and the bottom of the battery can 602, respectively. The safety valve mechanism 612 is electrically connected to the positive electrode cap 601 through a PTC element (Positive Temperature Coefficient) 611. The safety valve mechanism 612 cuts off electrical connection between the positive electrode cap 601 and the positive electrode 604 when the internal pressure of the battery exceeds a predetermined threshold value. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

A lithium-ion secondary battery using an electrolyte solution includes a positive electrode, a negative electrode, a separator, an electrolyte solution, and an exterior body. Note that in a lithium-ion secondary battery, an anode (positive electrode) and a cathode (negative electrode) are interchanged in charging and discharging, and oxidation reaction and reduction reaction are interchanged; thus, an electrode with a high reaction potential is called a positive electrode and an electrode with a low reaction potential is called a negative electrode. For this reason, in this specification, the positive electrode is referred to as a "positive electrode" or a "+ electrode (plus electrode)" and the negative electrode is referred to as a "negative electrode" or a "− electrode (minus electrode)" in any of the case where charging is performed, the case where discharging is performed, the case where reverse pulse current is supplied, and the case where charging current is supplied. The use of terms "anode" and "cathode" related to oxidation reaction and reduction reaction might cause confusion because the anode and the cathode interchange in charging and in discharging. Thus, the terms "anode" and "cathode" are not used in this specification. If the term "anode" or "cathode" is used, it should be clearly mentioned that the anode or the cathode is which of the one in charging or in discharging and corresponds to which of the positive electrode (plus electrode) or the negative electrode (minus electrode).

Figure 7C:
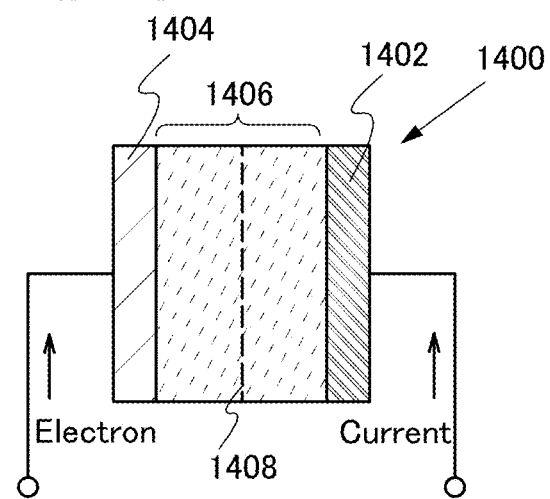

A charger is connected to two terminals illustrated in FIG. 7(C), and a storage battery 1400 is charged. As the charging of the storage battery 1400 proceeds, a potential difference between electrodes increases. A positive direction in FIG. 7(C) is a direction in which current flows from a terminal outside the storage battery 1400 to a positive electrode 1402; from the positive electrode 1402 to a negative electrode 1404 in the storage battery 1400; and from the negative electrode to the terminal outside the storage battery 1400. In other words, a direction in which charge current flows is regarded as the direction of current.

In this embodiment, an example of a lithium-ion secondary battery is shown; however, it is not limited to a lithium-ion secondary battery and a material including an element A, an element X, and oxygen can be used as a positive electrode material for the secondary battery, for example. The element A is preferably one or more selected from the Group 1 elements and the Group 2 elements. As the Group 1 element, for example, an alkali metal such as lithium, sodium, or potassium can be used. In addition, as the Group 2 element, for example, calcium, beryllium, magnesium, or the like can be used. As the element X, for example, one or more selected from metal elements, silicon, and phosphorus can be used. Furthermore, the element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector. In addition, the negative electrode active material layer may contain a conductive additive and a binder.

For a negative electrode active material, an element that enables charge-discharge reaction by alloying reaction and dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon. In particular, silicon has a high theoretical capacity of 4200 mAh/g.

In addition, the secondary battery preferably includes a separator. As the separator, for example, fiber containing cellulose such as paper; nonwoven fabric; glass fiber; ceramics; synthetic fiber using nylon (polyamide), vinylon (polyvinyl alcohol-based fiber), polyester, acrylic, polyolefin, or polyurethane; or the like can be used.

Figure 8A:
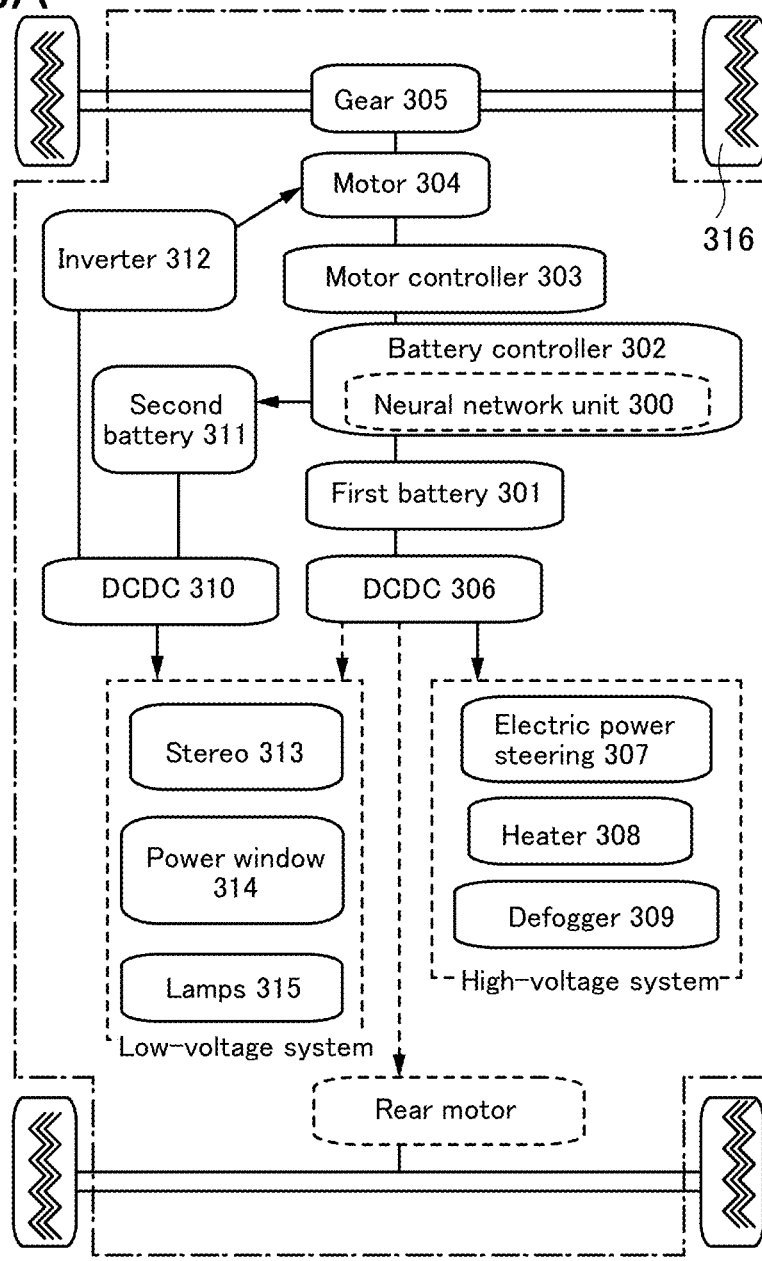
FIGS. 8A and 8B A block diagram of a moving object and a perspective view of an assembled battery.

In addition, FIG. 8(A) is an example of a block diagram of an electric vehicle.

In an electric vehicle, a first battery 301 as a secondary battery for main driving and a second battery 311 that supplies power to an inverter 312 starting a motor 304 are provided. In this embodiment, a neural network unit 300 driven by power supply from the second battery 311 selects and uses each of a plurality of secondary batteries constituting the first battery 301 individually.

The first battery 301 mainly supplies power to in-vehicle parts for 42 V (for a high-voltage system) and the second battery 311 supplies power to in-vehicle parts for 14 V (for a low-voltage system). As the second battery 311, a lead-acid battery is often adopted because it is advantageous in cost. Lead-acid batteries have disadvantages compared with lithium-ion secondary batteries in that they have a larger amount of self-discharge and are more likely to degrade due to a phenomenon called sulfation. An advantage of using a lithium-ion secondary battery as the second battery 311 is eliminating the need for maintenance; however, when the lithium-ion secondary battery is used over a long time, for example three years or longer, abnormalities that cannot be determined at the time of manufacturing the battery might occur. In particular, when the second battery 311 that starts the inverter becomes inoperative, the motor cannot be started even when the first battery 301 has remaining capacity; thus, in order to prevent this, in the case where the second battery 311 is a lead-acid battery, the second battery is supplied with power from the first battery to constantly maintain a fully-charged state.

In this embodiment, an example in which lithium-ion secondary batteries are used as both the first battery 301 and the second battery 311 is described. A lead-acid battery or an all-solid-state battery may be used as the second battery 311.

In addition, regenerative energy the rotation of tires 316 is transmitted to the motor 304 through a gear 305 and a motor controller 303 and a battery controller 302 charges the second battery 311 or the first battery 301.

In addition, the first battery 301 is mainly used to rotate the motor 304 and supplies power to in-vehicle parts for 42 V (such as an electric power steering 307, a heater 308, and a defogger 309) through a DCDC circuit 306. Even in the case where there is a rear motor for rear wheels, the first battery 301 is used to rotate the rear motor.

Furthermore, the second battery 311 supplies power to in-vehicle parts for 14 V (such as a stereo 313, a power window 314, and lamps 315) through a DCDC circuit 310.

Figure 8B:
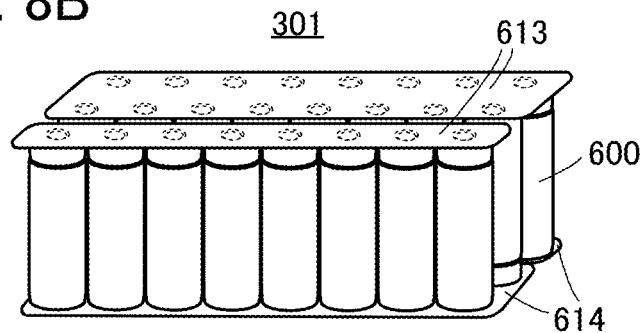

In addition, the first battery 301 is composed of a plurality of secondary batteries. As illustrated in FIG. 8(B), the cylindrical secondary battery 600 may be interposed between a conductive plate 613 and a conductive plate 614 to form a module for the first battery 301. In FIG. 8(B), switches are not illustrated between the secondary batteries. A plurality of secondary batteries 600 may be connected in parallel, connected in series, or connected in series after being connected in parallel. By forming a module including the plurality of secondary batteries 600, large power can be extracted.

In order to cut off power from the plurality of secondary batteries, the secondary batteries in the vehicle include a service plug or a circuit breaker that can cut off high voltage without the use of equipment; these are provided in the first battery 301. For example, in the case where 48 battery modules that each include two to ten cells are connected directly, the service plug or the circuit breaker is placed between a 24th module and a 25th module.

In addition, a circuit (a microcomputer) that performs neural network calculation may be incorporated in a vehicle component other than the battery controller or may be incorporated in a portable information terminal of a passenger. The microcomputer includes a CPU, a ROM, a RAM, or the like. Furthermore, in the neural network calculation, communication with another computer may be performed and data accumulated in the other computer may be used. When the communication with another computer is performed and the data accumulated in the other computer is used to perform the neural network calculation, the neural network calculation can be performed using a huge amount of data.

The neural network unit 300 performs learning using the same type of battery as the first battery 301 in advance; thus, the SOC of the first battery 301 can be output with high accuracy.

In addition, this embodiment can be freely combined with Embodiment 1 or Embodiment 2.

Embodiment 4

Figure 9A:
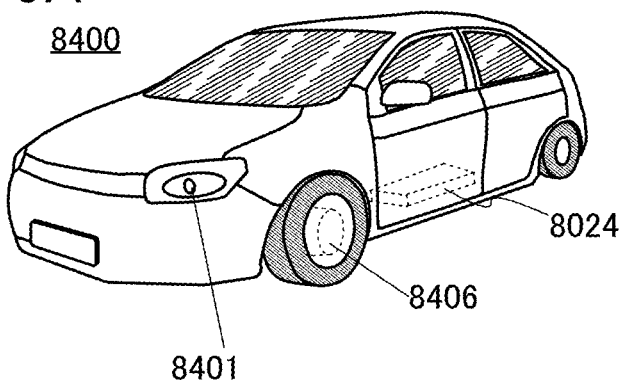
FIGS. 9A to 9C Diagrams showing moving object structures.

FIG. 9 illustrates examples of vehicles using a state of charge estimation system of a secondary battery according to one embodiment of the present invention. A secondary battery 8024 in an automobile 8400 illustrated in FIG. 9(A) not only drives an electric motor 8406 but also can supply power to a light-emitting device such as a headlamp 8401 or a room light (not illustrated). As the secondary battery 8024 in the automobile 8400, the first battery 301 may be used in which the cylindrical secondary battery 600 illustrated in FIG. 7(B) is interposed between the conductive plate 613 and the conductive plate 614.

Figure 9B:
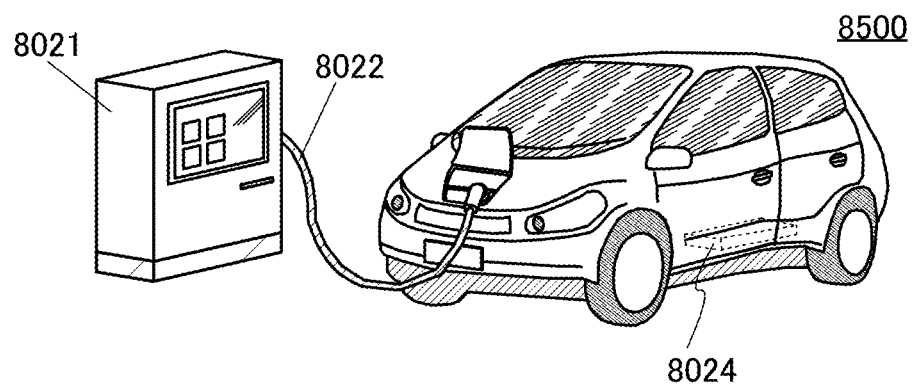

An automobile 8500 illustrated in FIG. 9(B) can be charged when the secondary battery 8024 included in the automobile 8500 is supplied with power through external charging equipment by a plug-in system, a contactless power feeding system, or the like. FIG. 9(B) illustrates a state in which the secondary battery 8024 incorporated in the automobile 8500 is charged with a ground-based charging device 8021 through a cable 8022. Charging is performed as appropriate by a given method such as CHAdeMO (registered trademark) or Combined Charging System as a charging method, the standard of a connector, or the like. The charging device 8021 may be a charging station provided in a commerce facility or a power source in a house. For example, with a plug-in technique, the secondary battery 8024 incorporated in the automobile 8500 can be charged by power supply from the outside. Charging can be performed by converting AC power into DC power through a converter such as an ACDC converter.

Furthermore, although not illustrated, a power receiving device can be incorporated in the vehicle, and the vehicle can be charged by being supplied with power from an above-ground power transmitting device in a contactless manner. In the case of this contactless power feeding system, by incorporating a power transmitting device in a road or an exterior wall, charging can also be performed while the vehicle is driven without limitation on the period while the vehicle is stopped. In addition, this contactless power feeding system may be utilized to transmit and receive power between vehicles. Furthermore, a solar cell may be provided in an exterior part of the vehicle to charge the secondary battery while the vehicle is stopped or while the vehicle is driven. For power supply in such a contactless manner, an electromagnetic induction method or a magnetic resonance method can be used.

Figure 9C:
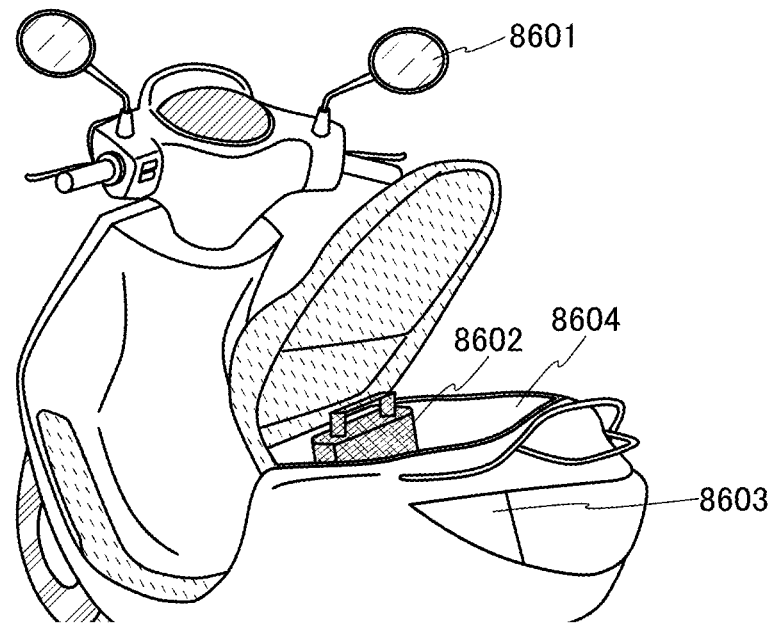

In addition, FIG. 9(C) is an example of a motorcycle using an estimation system of a state of charge of a secondary battery according to one embodiment of the present invention. A scooter 8600 illustrated in FIG. 9(C) includes a secondary battery 8602, side mirrors 8601, and direction indicator lamps 8603. The secondary battery 8602 can supply electricity to the direction indicator lamps 8603.

Furthermore, in the scooter 8600 illustrated in FIG. 9(C), the secondary battery 8602 can be stored in an under-seat storage 8604. The secondary battery 8602 can be stored in the under-seat storage 8604 even when the under-seat storage 8604 is small.

Figure 10:
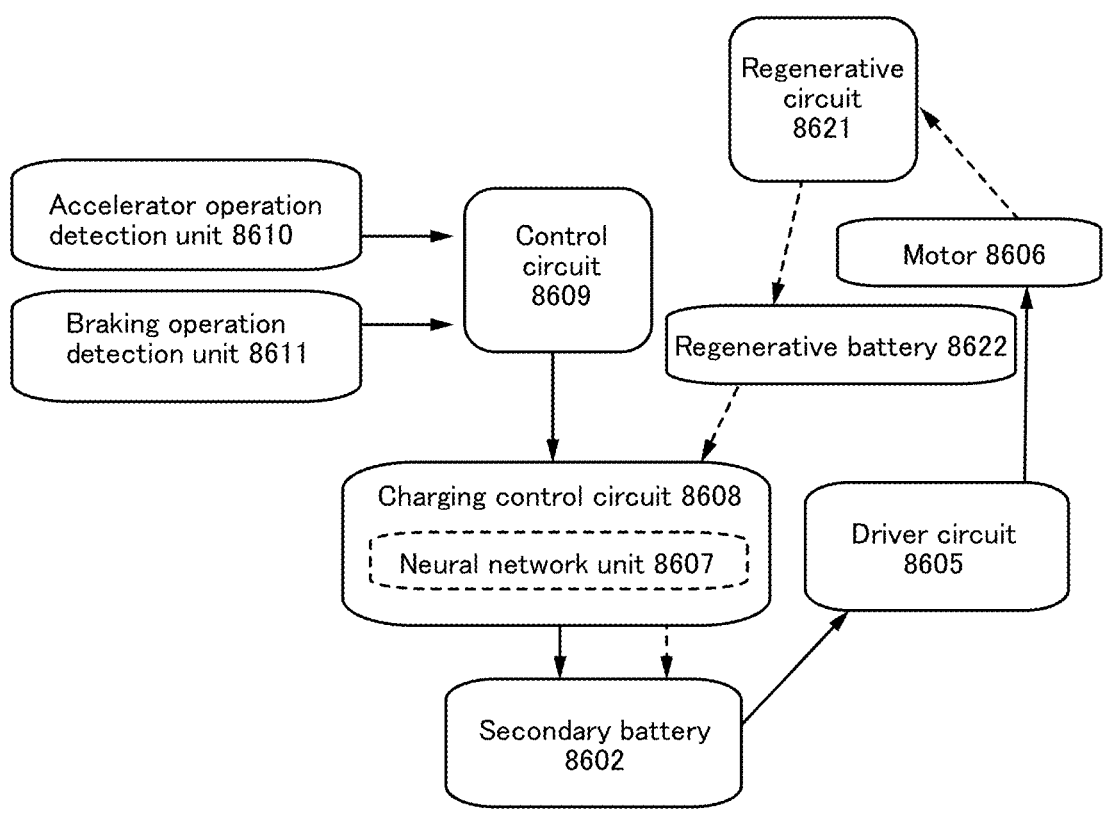
FIG. 10 A block diagram of a moving object.

FIG. 10 is an example of a block diagram of the scooter 8600.

The voltage of the secondary battery 8602 in the scooter 8600 is 48 V or 60 V, and power is supplied to the motor 8606. After a converter lowers the voltage to 12 V, power is supplied to electric equipment such as the direction indicator lamps 8603. An in-wheel motor in which a motor is directly set in a wheel that is to be a driving wheel can also be used.

The charging of the secondary battery 8602 in the scooter 8600 is controlled by a charging control circuit 8608, and the SOC of the secondary battery 8602 is estimated by a neural network unit 8607.

In addition, in the case where regenerative power is used for charging, a regenerative circuit 8621 and a regenerative battery 8622 may be provided. In the case where regenerative power is not used for charging, it is possible to eliminate the need for the regenerative circuit 8621 and the regenerative battery 8622.

Furthermore, when a driver performs accelerator operation, a signal from an accelerator operation detection unit 8610 is transmitted to the control circuit 8609, and the power of the secondary battery is transmitted to the motor in accordance with the degree of opening of an accelerator. Moreover, when the driver performs braking operation, a signal from a braking operation detection unit 8611 is transmitted to the control circuit 8609, the regenerative battery 8622 is once charged with regenerative power at the time of deceleration, and the secondary battery 8602 is charged through the charging control circuit 8608. The charging history is learned by the neural network unit 8607 and feedback is performed.

This embodiment can be combined with the description of the other embodiment as appropriate.

REFERENCE NUMERALS

10: secondary battery, 11: data acquisition unit, 12: data creation unit, 13: label storage unit, 14: database creation unit, 20: secondary battery, 21: data acquisition unit, 22: data creation unit, 23: neural network unit, 300: neural network unit, 301: battery, 302: battery controller, 303: motor controller, 304: motor, 305: gear, 306: DCDC circuit, 307: electric power steering, 308: heater, 309: defogger, 310: DCDC circuit, 311: battery, 312: inverter, 314: power window, 315: lamps, 316: tire, 600: secondary battery, 601: positive electrode cap, 602: battery can, 603: positive electrode terminal, 604: positive electrode, 605: separator, 606: negative electrode, 607: negative electrode terminal, 608: insulating plate, 609: insulating plate, 611: PTC element, 612: safety valve mechanism, 613: conductive plate, 614:

conductive plate, 1400: storage battery, 1402: positive electrode, 1404: negative electrode, 8021: charging device, 8022: cable, 8024: secondary battery, 8400: automobile, 8401: headlamp, 8406: electric motor, 8500: automobile, 8600: scooter, 8601: side mirror, 8602: secondary battery, 8603: direction indicator lamp, 8604: under-seat storage, 8606: motor, 8607: neural network unit, 8608: charging control circuit, 8609: control circuit, 8610: accelerator operation detection unit, 8611: braking operation detection unit, 8621: regenerative circuit, and 8622: regenerative battery.

The invention claimed is:

1. An estimation system of a state of charge of a second power storage device comprising:
a computer configured to:
acquire voltage time-series data of a first power storage device and current time-series data of the first power storage device; and
store the voltage time-series data of the first power storage device and the current time-series data of the first power storage device as normalized data in a database, in which a state of charge of the first power storage device is linked to first superimposed data; and
a neural network unit comprising a neural network configured to include the data in the database as learning data, the neural network unit configured to output, based upon the learning data, an estimated state of charge value of the second power storage device when a second superimposed data is input,
wherein the first superimposed data is formed by superimposing first data where a vertical axis represents a voltage value of normalized voltage time-series data of the first power storage device and a horizontal axis represents a time axis of the normalized voltage time-series data of the first power storage device on second data where a horizontal axis represents a current value of normalized current time-series data of the first power storage device and a vertical axis represents a time axis of the normalized current time-series data of the first power storage device, and
wherein the second superimposed data is formed by superimposing third data where a vertical axis represents a voltage value of normalized voltage time-series data of the second power storage device and a horizontal axis represents a time axis of the normalized voltage time-series data of the second power storage device on fourth data where a horizontal axis represents a current value of normalized current time-series data of the second power storage device and a vertical axis represents a time axis of the normalized current time-series data of the second power storage device.

2. The estimation system of a state of charge of a second power storage device, according to claim 1, wherein the second power storage device includes a plurality of battery cells.

3. The estimation system of a state of charge of a second power storage device, according to claim 1, wherein the neural network is a convolutional neural network.

4. The estimation system of a state of charge of a second power storage device according to claim 1, wherein each of the first superimposed data and the second superimposed data is image data.

5. The estimation system of a state of charge of a second power storage device according to claim 1, wherein each of the first superimposed data and the second superimposed data is encoded digital data.

* * * * *